(12) United States Patent
Venca

(10) Patent No.: US 12,143,009 B2
(45) Date of Patent: Nov. 12, 2024

(54) CONTROL SYSTEM FOR UHF RFID PASSIVE TAGS

(71) Applicant: EM Microelectronic-Marin SA, Marin (CH)

(72) Inventor: Alessandro Venca, Hauterive (CH)

(73) Assignee: EM Microelectronic-Marin SA, Marin (CH)

( * ) Notice: Subject to any disclaimer, the term of this patent is extended or adjusted under 35 U.S.C. 154(b) by 203 days.

(21) Appl. No.: 17/774,384

(22) PCT Filed: Dec. 16, 2020

(86) PCT No.: PCT/EP2020/086556
§ 371 (c)(1),
(2) Date: May 4, 2022

(87) PCT Pub. No.: WO2021/089885
PCT Pub. Date: May 14, 2021

(65) Prior Publication Data
US 2022/0406397 A1  Dec. 22, 2022

(30) Foreign Application Priority Data

Jan. 29, 2020 (EP) .................................... 20154405
Nov. 5, 2020 (WO) ................. PCT/EP2020/081170

(51) Int. Cl.
| | |
|---|---|
| *H02M 3/07* | (2006.01) |
| *G06K 19/07* | (2006.01) |
| *G11C 5/14* | (2006.01) |
| *G11C 29/02* | (2006.01) |
| *G11C 29/50* | (2006.01) |
| *H02M 1/00* | (2006.01) |

(52) U.S. Cl.
CPC .......... *H02M 3/07* (2013.01); *G06K 19/0713* (2013.01); *G11C 5/145* (2013.01); *G11C 29/028* (2013.01); *G11C 29/50008* (2013.01); *H02M 1/0012* (2021.05); *H02M 1/0025* (2021.05); *H02M 3/073* (2013.01)

(58) Field of Classification Search
CPC .... H02M 3/07; H02M 1/0012; H02M 1/0025; H02M 3/073; H02M 1/0003; H02M 1/0048; G06K 19/0713; G11C 5/145; G11C 29/028; G11C 29/50008; Y02B 70/10
See application file for complete search history.

(56) References Cited

U.S. PATENT DOCUMENTS 6,617,832 B1 * 9/2003 Kobayashi .............. H02M 3/07
323/280
2012/0293893 A1  11/2012 Sato

OTHER PUBLICATIONS

International Search Report issued Mar. 9, 2021 in PCT/EP2020/086556, filed on Dec. 16, 2020, 2 pages.

* cited by examiner

*Primary Examiner* — Jung Kim
(74) *Attorney, Agent, or Firm* — Oblon, McClelland, Maier & Neustadt, L.L.P.

(57) ABSTRACT

A power control unit is provided to monitor the output power of a charge pump converter having an input impedance and an input impedance controlling terminal to be plugged to the power control unit and modify the input impedance. The power control unit includes a control circuit sense the output power of the charge pump converter and a control unit to receive the sensed power value, establish a control value, and send the control value to the impedance controlling terminal so as to modify the input impedance.

12 Claims, 10 Drawing Sheets

CONTROL SYSTEM FOR UHF RFID PASSIVE TAGS

TECHNICAL FIELD

The present invention relates to the field of power control unit and in particular of a power control unit for UHF RFID passive tags.

STATE OF THE ART

In general, in an RFID communication system, the receiving tag antenna is adapted to maximize the received signal at a specific frequency, i.e. the tuning frequency $f_0$. The adaptation is achieved for a specific antenna and tag input impedance.

In this adapted condition, the received power is maximized, and the Mismatch Loss, ML for short, is minimized.

Every time the input frequency signal carrier fc differs from $f_0$, or the tag or antenna impedances differ from the value needed to achieve adaptation the system suffers a loss in the received power.

In operative conditions, the above disrupting scenario may happen for the following reasons:
- The input signal frequency can operate at different frequencies in the UHF RFID band [860-960] MHz;
- Variations in electronic components values due to process or temperature may cause variation in the tag input impedance; and,
- Environmental conditions in which the tag operates, e.g. medium, humidity, temperature, may alter the antenna adaptation.

Therefore, there is a need to maximize the tag reading distance and this independently of the operative conditions.

U.S. Patent Application Publication No. 2012/0293893 A1 describes a power source circuit including a voltage converter circuit and a control circuit that includes a voltage divider circuit and a protective circuit. The protective circuit includes a first oxide semiconductor transistor in which an off-state current is increased as temperature is increased, a capacitor that accumulates the off-state current as electric charge, a second oxide semiconductor transistor, and an operational amplifier including a non-inverting input terminal to which a reference voltage input. The first oxide semiconductor transistor is provided near the voltage converter circuit or an element that generates heat in the control circuit. However it is not provided to control an output current from a charge pump converter and to measure an output voltage between signal outputs.

SUMMARY OF THE INVENTION

In order to achieve this objective, the present invention provides a power control unit configured to monitor the output power of a device having an input impedance between a first input terminal and a second input terminal, and having a first output terminal, a second output terminal and an input impedance controlling terminal configured to be plugged to said power control unit; said input impedance controlling terminal is configured to modify said input impedance; said power control unit comprising at least:
- a control circuit: said at least control circuit is configured to sense said output power of said device through said first output terminal and said second output terminal and to transmit a sensed power value as a function of the sensed output power; and
- a control unit: said at least a control unit is configured to receive said sensed power value, to establish a control value and to send said control value to said impedance controlling terminal such as to modify said input impedance.

Thus, this configuration allows sensing the received power and take actions to minimize the tag sensitivity and thus maximize the tag reading distance.

According to an embodiment, said sensed power value comprises a voltage sensed power value and/or current sensed power value.

According to an embodiment, said voltage sensed power value and/or said current sensed power value is or are analog signal.

Thus, the transmission of said sensed power value as a function of the sensed output power is quicker than digital signal.

According to an embodiment, said control circuit comprises at least one control circuit configured to determine at least a first physical quantity between said first terminal and said second terminal and to measure at least a second physical quantity.

According to an embodiment, said control circuit is configured to control an output current from said device and to measure an output voltage between said first output terminal and said second output terminal at lower input power levels across said first input terminal and said second input terminal, and/or to control said output voltage and measure said output current at higher input power levels.

According to an embodiment, said at least control circuit is configured to conduct a current value by diverting said output current from said first output terminal to said second output terminal such as to evaluate the sensed power value.

According to an embodiment, said at least a control circuit comprises at least:
- a power input terminal: said power input terminal is configured to sense said output current and/or said output voltage value of said device;
- an internal reference: said at least internal reference is configured to set a reference value;
- a comparison circuit: said at least a comparison circuit configured to compare said reference value to said output current value and/or said output voltage value; and
- a current limited buffer: said at least a current limited buffer is configured to divert the current from said first output terminal to said second output terminal such as to evaluate the sensed power value.

According to an embodiment, said at least control unit comprises at least a controller configured to establish an established voltage value and/or an established current value as a function of said sensed current value and/or said sensed voltage value of said device.

According to an embodiment, said at least bias supplier comprises at least a converter configured to convert said sensed current value and/or said sensed voltage value of said device into a digital voltage value and/or a digital current value.

The present invention relates to a control system device comprising at least one power control unit according any preceding claims and at least one charge pump converter; said at least one charge pump converter comprising at least one primary gate controller and at least one secondary gate controller; said at least one primary gate controller comprises at least one;

primary signal output: said at least one primary signal output is configured to be connected to an at least one second primary signal input of a charge pump converter and/or a first circuit;

first primary signal input: said at least one first primary signal input is configured to receive a first control signal;

primary bias input: said at least one primary bias input configured to establish a voltage value and/or a current value of said at least one primary gate controller;

second primary signal input: said at least one second primary signal input configured to be connected to an at least one primary signal output of a charge pump converter and/or to receive said main signal, preferably from an antenna, from an integrated circuit, at least one primary signal and/or from a charge pump converter; and, said at least one secondary gate controller comprises at least one:

secondary signal output: said at least one secondary signal output is configured to be connected to an at least one second secondary signal input of a charge pump converter and/or a second circuit;

first secondary signal input: said at least one first secondary signal input is configured to receive a second control signal;

secondary bias input: at least one secondary bias input configured to establish a voltage value and/or a current value of said at least one secondary gate controller; and, second secondary signal input: said at least one second secondary signal input configured to be connected to an at least one secondary signal output of a charge pump converter and/or to receive a main signal, preferably from an antenna, from an integrated circuit, at least one secondary signal and/or from a charge pump converter;

said at least one first primary signal input is configured to be connected to said at least one secondary signal output and said at least one first secondary signal input is configured to be connected to said at least one primary signal output.

Thanks to the arrangement according to the invention, said control system device allows sensing the received power and take actions to minimize the tag sensitivity and thus maximize the tag reading distance by adjusting the bias voltage of the gate by coupling the gate of the switching element to the output of the previous charge pump converter stage and said at least one bias input, which sets the DC gate's voltage reference bias.

According to an embodiment, said at least one primary gate controller comprises at least one primary switching element having a primary conduction path with a first primary terminal and a second primary terminal, and a primary gate configured to control the current flowing through said primary conduction path, said primary conduction path being configured to provide said at least one primary signal; said primary gate is configured to be connected to said at least one first primary signal input and to said at least one primary bias input, and/or wherein said at least one secondary gate controller comprises at least one secondary switching element having a secondary conduction path with a first secondary terminal and a second secondary terminal, and a secondary gate configured to control the current flowing through said secondary conduction path, said secondary conduction path being configured to provide said at least one secondary signal; said secondary gate is configured to be connected to said at least one first secondary signal input and to said at least one secondary bias input.

Thanks to the arrangement according to the invention, the charge pump converter stage allows adjusting the bias voltage of the gate by coupling the gate of the switching element to the output of the previous charge pump converter stage and said at least one bias input, which sets the DC gate's voltage reference bias.

According to an embodiment, said at least one primary bias input comprises a plurality of primary bias current flow controller comprising at least one first primary bias current flow controller and/or at least one second primary bias transistor and/or wherein said at least one secondary bias input comprises a plurality of secondary bias current flow controller comprising at least one first secondary bias current flow controller and/or at least one second secondary bias transistor.

According to an embodiment, said at least one charge pump converter comprises at least one input impedance controlling terminal configured to be plugged to said power control unit such as to modify said input impedance.

According to an embodiment, said at least one input impedance controlling terminal is configured to control the current flowing through said primary conduction path or said secondary conduction path and preferably of said at least one first primary bias current flow controller said at least one second primary bias transistor, said at least one first secondary bias current flow controller and/or said at least one second secondary bias transistor.

Thanks to one of those arrangements according to the invention, the conduction path of the switching element may be controlled.

BRIEF DESCRIPTION OF THE DRAWINGS

The foregoing and other purposes, features, aspects and advantages of the invention will become apparent from the following detailed description of the embodiments, given by way of illustration and not limitation with reference to the accompanying drawings, in which:

FIG. 6 illustrates a AutoMatch tag performances at $f_{in}=f_0+45$ MHz; and, FIG. 7 represents a control system device 600 comprising a plurality of charge pump converters 500 and at least one power control unit 100 according to the invention.

DESCRIPTION OF THE INVENTION

The present invention relates to a control system device 600 comprising at least one charge pump converter 500 and at least one power control unit 100 configured to monitor the output power of said at least one charge pump converter 500 such as to maximize the received signal at a specific frequency, i.e. the tuning frequency $f_0$.

Indeed, said power control unit 100 may be connected to a Programmable Self-Biased Gate Control 500, PSBGC 500 for short.

Figure 1A:
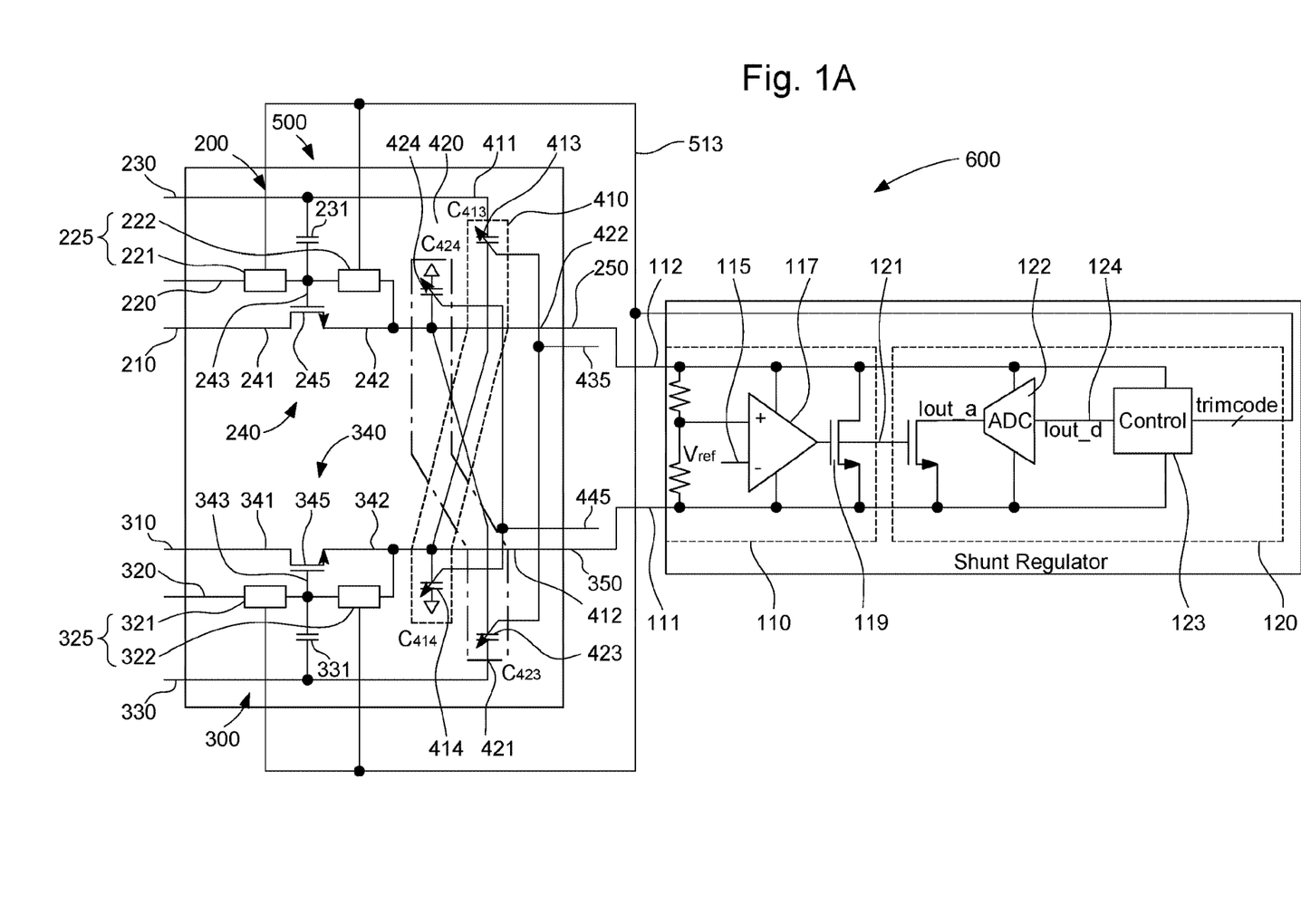
FIGS. 1A and 1B represent a control system device 600 according to the invention.
Figure 1B:
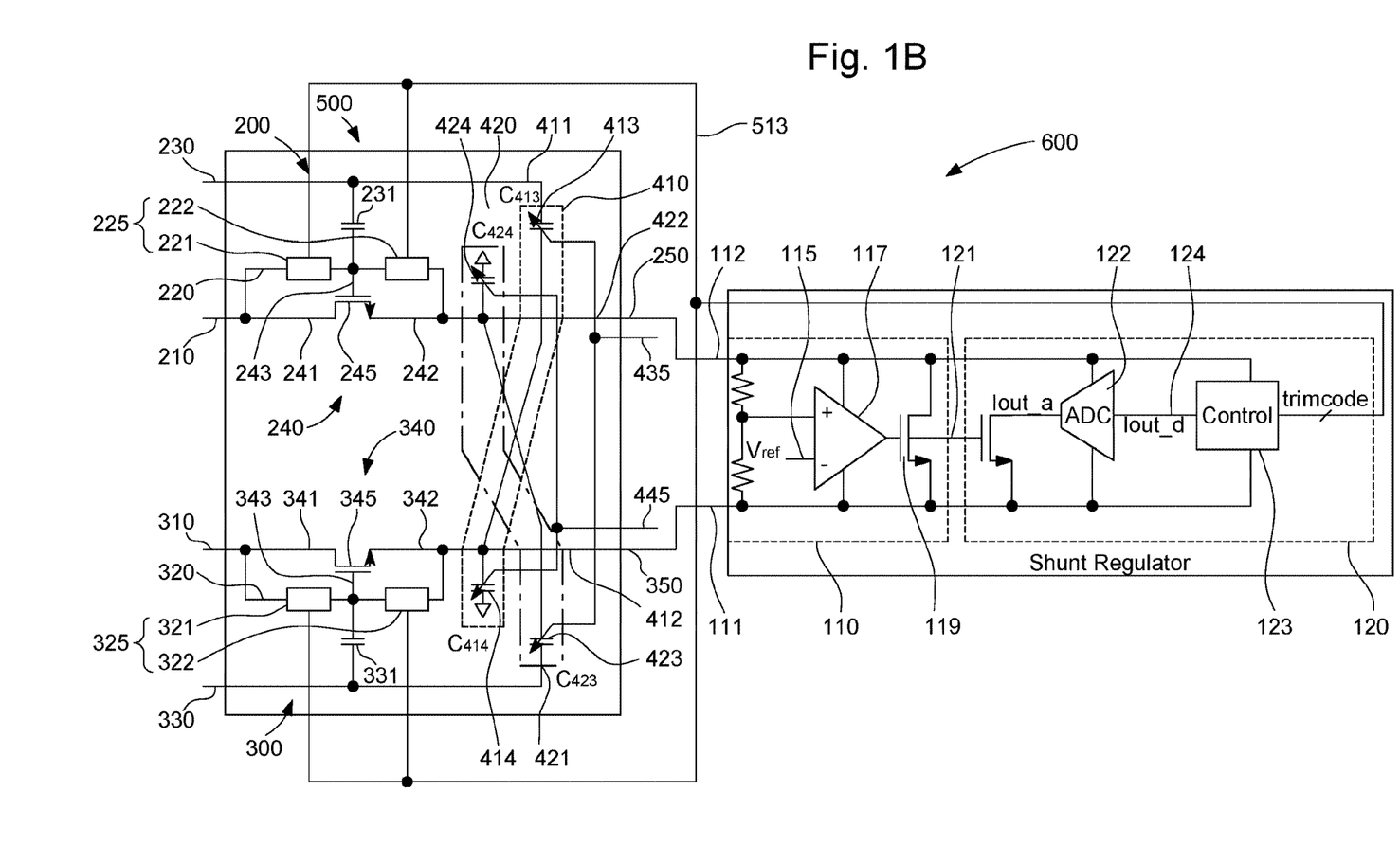

The Programmable Self-Biased Gate Control 500 or PSBGC 500 may have an input impedance between at least one second primary signal input 210 and at least one second secondary signal input 310, and at least one primary signal output 250, at least one secondary signal output 350 and an input impedance controlling terminal 513, as illustrated in FIGS. 1A and 1B.

Said input impedance controlling terminal 513 may be configured to be plugged to said power control unit 100 and to modify said input impedance according a signal from said power control unit 100.

Figure 2:
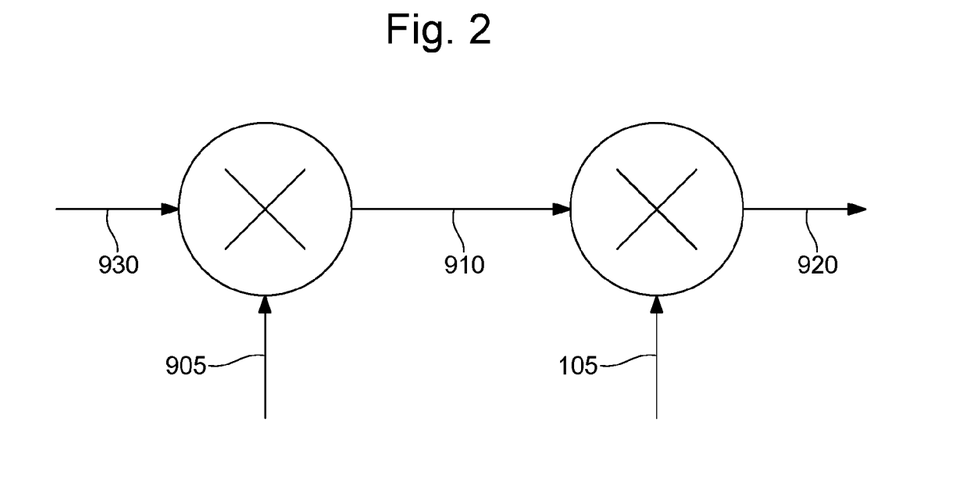
FIG. 2 shows a block diagram.

Effectively, to maximize the received power, $P_{in}$ 910 for short, is a necessary but not yet enough condition to maximize the load power, i.e. the rectifier output power, $P_{out}$ 920 for short, and in order to maximize the load power it is necessary to maximize also the rectifier efficiency, eff 105 for short, see FIG. 2.

The relation between the power available at the antenna, $P_{avail}$ 930 for short, and the load power, $P_{out}$ for short, being:

$$P_{out} = P_{avail} * \frac{eff}{ML} \text{ where } eff = \frac{P_{out}}{P_{in}} \text{ and } ML = \frac{P_{avail}}{P_{in}}$$

The mismatch loss, ML 905 for short, can be expressed in terms of the series impedances of antenna and tag as:

$$\frac{1}{ML} = \frac{4R_a R_{ts}}{(R_a + R_{ts})^2 + (X_a + X_{ts})^2}$$

Where the antenna series impedance is $Z_\alpha = R_\alpha + jX_\alpha$ and the tag series impedance is $Z_{ts} = R_{ts} + jX_{ts}$.

The ML is minimized, i.e. ML=1, at conjugate matching. In others words, when $R_\alpha = R_{ts}$ and $X_\alpha = X_{ts}$.

The following «match» parameter is used hereafter to quantify the load power for a given available power:

$$\frac{eff}{ML} = eff * \frac{4R_a R_{ts}}{(R_a + R_{ts})^2 + (X_a + X_{ts})^2} = \frac{P_{out}}{P_{avail}} \text{ with } 0 \leq \frac{eff}{ML} \leq 1$$

Figure 3:
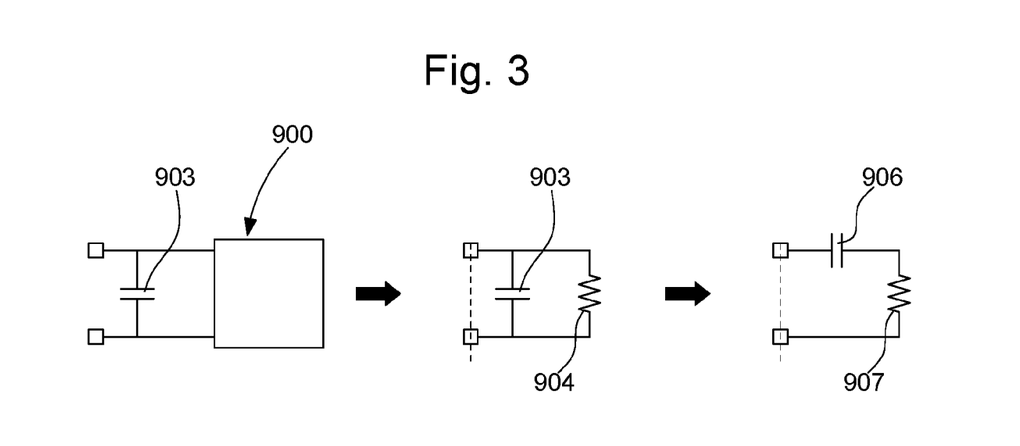
FIG. 3 illustrates a parallel equivalent circuit and a series equivalent circuit of at least one charge pump converter 500.
Figure 4A:
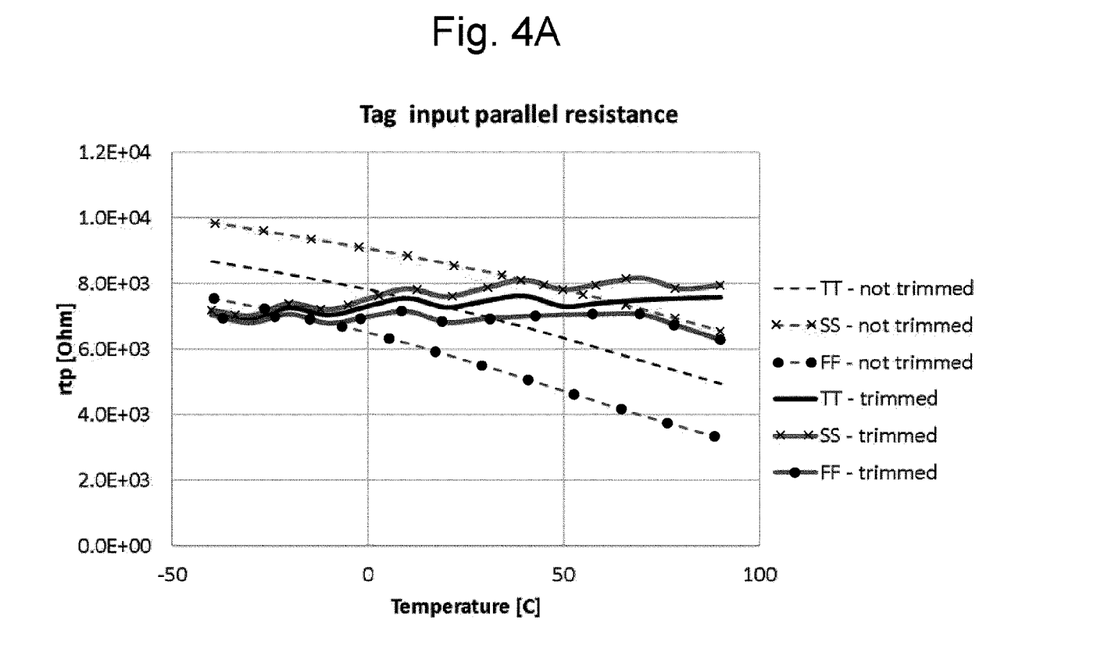
FIGS. 4A-4G represent a AutoMatch tag performances at $f_{in}=f_0$.
Figure 4B:
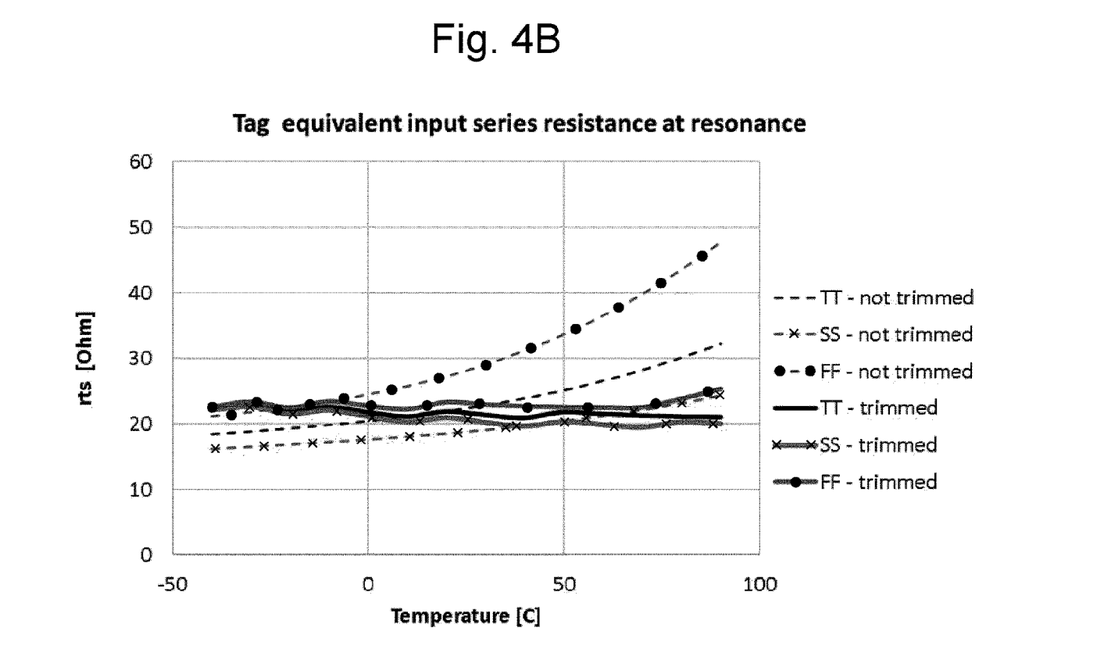
Figure 4C:
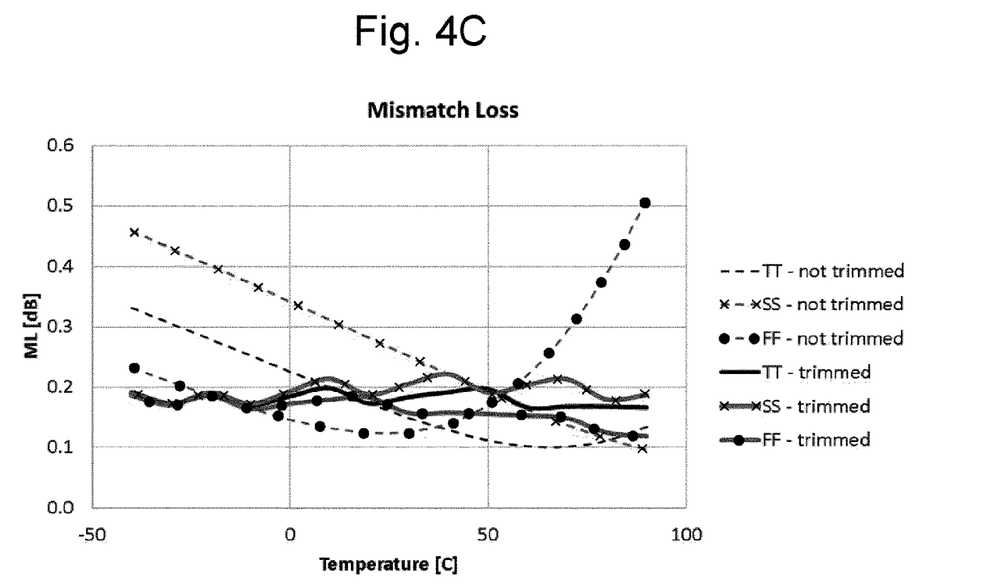
Figure 4D:
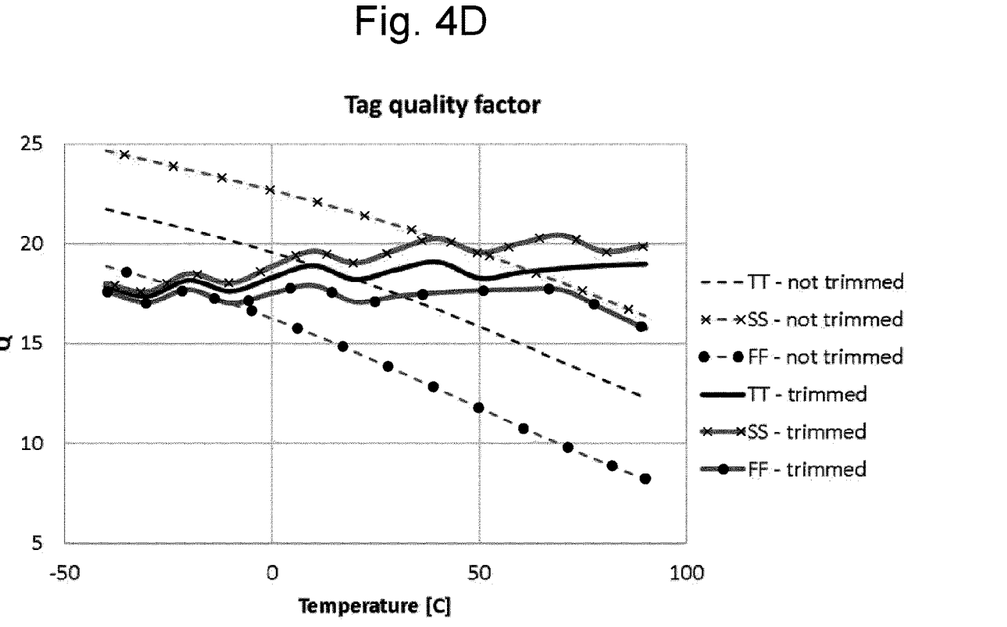
Figure 4E:
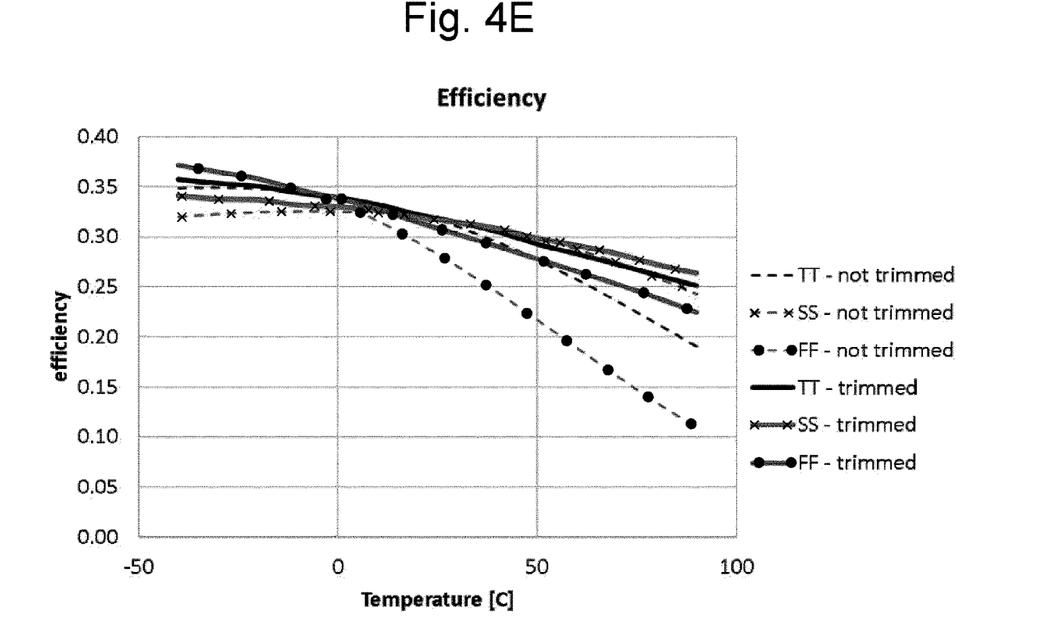
Figure 4F:
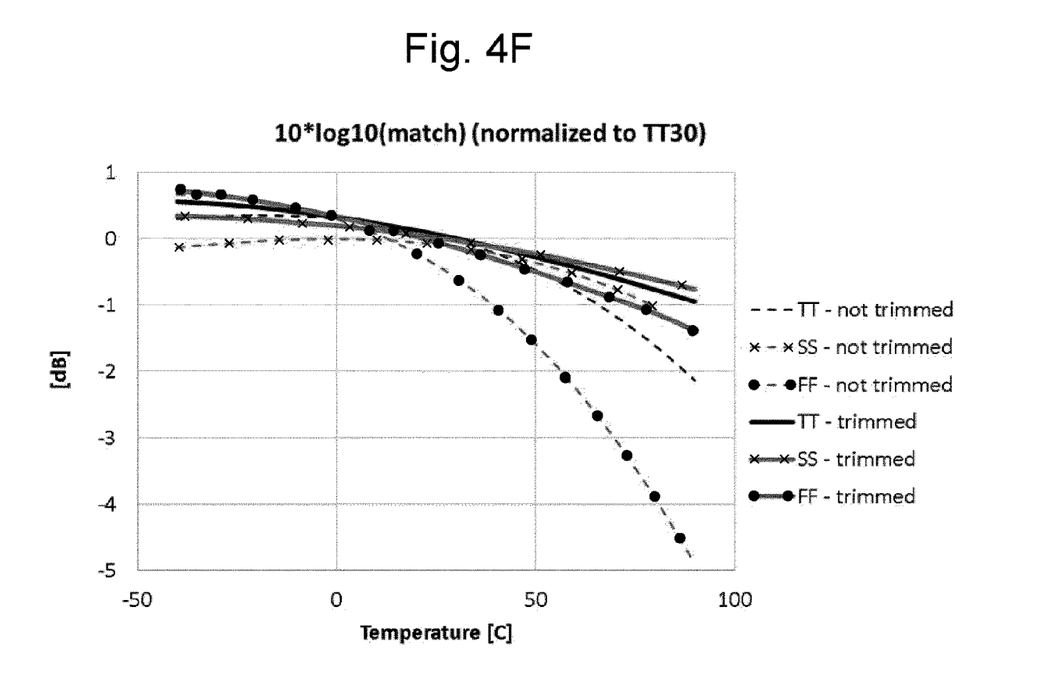
Figure 4G:
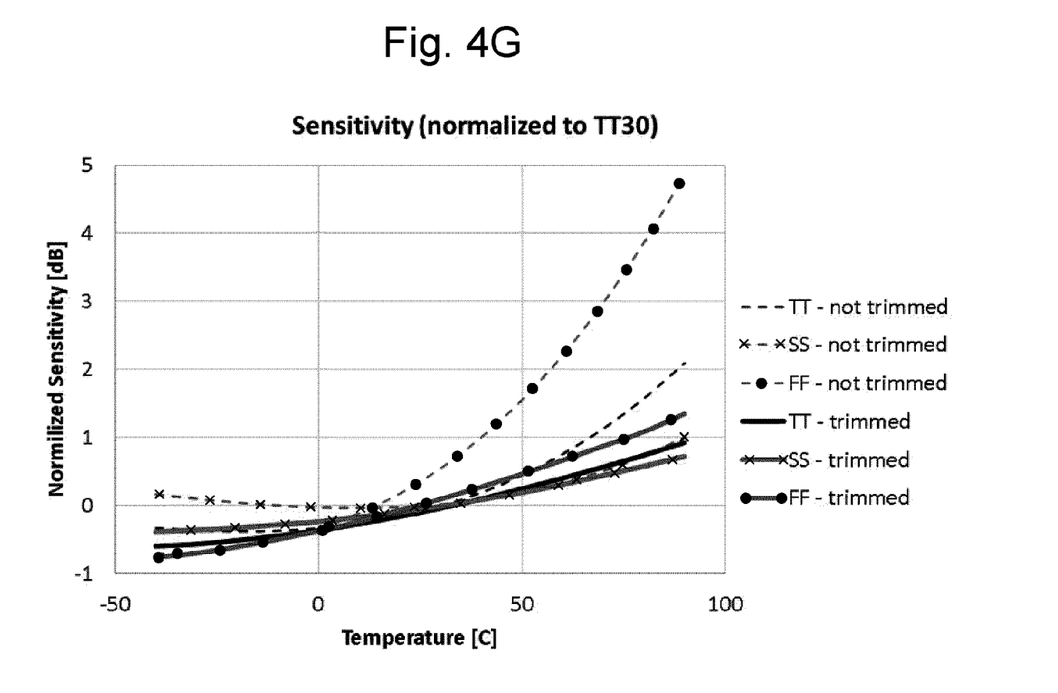

In a RFID tag front-end the input equivalent circuit is a parallel of a resistance, $R_{tp}$ 904 for short, and a capacitance, $C_{tp}$ 903 for short.

The input parallel resistance is defined by the rectifier input parallel resistance.

At the frequency $f_0$ the parallel equivalent circuit can be represented by the equivalent series circuit, $R_{ts}$ 907 and $C_{ts}$ 906, according to the transformation formulas:

$$R_{ts} = \frac{R_{tp}}{1 + Q^2}$$

$$C_{ts} = C_{tp} \frac{1 + Q^2}{Q^2}$$

$$Q = 2\pi f_0 C_{tp} R_{tp}$$

Said power control unit 100, according to the present invention, may sense the rectifier output power $P_{out}$ and controls the match parameter thus in turn controlling the rectifier input resistance $R_{tp}$ and efficiency eff. The match parameter may be a function of ML, i.e. function of $R_{ts}$ and $R_{tp}$, and eff.

The control on the rectifier input resistance and efficiency is based on charge pump topology, as described in EP19207239. In particular, the applicant hereby incorporates p.5,1.24-p7,1.30, p.8, 1.3-p.9, 1.17, p.9,1.20-p.10,1.2 and p.11, 1.1-24 of EP 19207239 herein by reference.

More precisely, the control on the rectifier input resistance and efficiency may act on a gate controller 200, 300 of a charge pump converter 500.

The charge pump converter 500 may have an input impedance between a first input terminal 210 and a second input terminal 310, and a first output terminal 250, a second output terminal 350, a primary bias current flow controller 225, a secondary bias current flow controller 325, a primary attenuator controlling terminal 435 and a secondary attenuator controlling terminal 445, as illustrated in FIGS. 1A and 1B.

Said primary bias current flow controller 225 and said secondary bias current flow controller 325 may be configured to be plugged to said power control unit 100 and to modify input impedance, and said primary attenuator controlling terminal 435 and said secondary attenuator controlling terminal 445 may be configured to be plugged to said power control unit 100 and to modify a K-factor.

Effectively, to maximize the received power, $P_{in}$ 910 for short, may be a necessary but not yet enough condition to maximize the load power, i.e. the rectifier output power, $P_{out}$ 920 for short, and in order to maximize the load power it may be necessary to maximize also the rectifier efficiency, eff 105 for short, and the K-factor, also known as Q-factor.

The relation between the power available at the antenna, $P_{avail}$ 930 for short, and the load power, $P_{out}$ for short, being:

$$P_{out} = P_{avail} * \frac{eff}{ML} \text{ where } eff = \frac{P_{out}}{P_{in}} \text{ and } ML = \frac{P_{avail}}{P_{in}}$$

The mismatch loss, ML 905 for short, can be expressed in terms of the series impedances of antenna and tag as:

$$\frac{1}{ML} = \frac{4R_a R_{ts}}{(R_a + R_{ts})^2 + (X_a + X_{ts})^2}$$

Where the antenna series impedance may be $Z_\alpha = R_\alpha + jX_\alpha$ and the tag series impedance may be $Z_{ts} = R_{ts} + R_{ts} + jX_{ts}$.

The ML may be minimized, i.e. ML=1, at conjugate matching. In others words, when $R_\alpha = R_{ts}$ and $X_\alpha = X_{ts}$.

The following «match» parameter may be used hereafter to quantify the load power for a given available power:

$$\frac{eff}{ML} = eff * \frac{4R_a R_{ts}}{(R_a + R_{ts})^2 + (X_a + X_{ts})^2} = \frac{P_{out}}{P_{avail}} \text{ with } 0 \leq \frac{eff}{ML} \leq 1$$

In a RFID tag front-end the input equivalent circuit may be a parallel of a resistance, $R_{tp}$ 904 for short, and a capacitance, $C_{tp}$ 903 for short.

The input parallel resistance may be defined by the rectifier input parallel resistance.

At the frequency $f_0$ the parallel equivalent circuit can be represented by the equivalent series circuit, $R_{ts}$ 907 and $C_{ts}$ 906, according to the transformation formulas:

$$R_{ts} = \frac{R_{tp}}{1 + Q^2}$$

$$C_{ts} = C_{tp} \frac{1+Q^2}{Q^2}$$

$$Q = 2\pi f_0 C_{tp} R_{tp}$$

Said power control unit 100, according to the present invention, may sense the rectifier output power $P_{out}$ and controls the match parameter thus in turn controlling the rectifier input resistance $R_{tp}$ and efficiency eff. The match parameter may be a function of ML, i.e. function of $R_{ts}$ and $R_{tp}$, and eff.

The control on the rectifier input resistance and efficiency may be based on charge pump converter topology, as described in EP19207239, in particular, the applicant hereby incorporates p.5, 1.24-p7,1.30, p.8,1.3-p,9, 1,17, p.9, 1.20-p.10, 1.2 and p,11, 1,1-24 by reference to EP19207239.

More precisely, the control on the rectifier input resistance and efficiency may act on said primary bias current flow controller 225 and said secondary bias current flow controller 325, and said primary attenuator controlling terminal 435 and said secondary attenuator controlling terminal 445 respectively of said charge pump converter 500.

Said charge pump converter 500 may comprise at least one primary gate controller 200 and at least one secondary gate controller 300 as depicted in FIGS. 1A and 1B. Said at least one primary gate controller 200 may comprise at least one primary signal output 250, at least one first primary signal input 230, at least one primary bias input 220 and at least one second primary signal input 210.

Said at least one primary signal output 250 may be connected to at least one power control unit 100 or in series to a first circuit and/or an at least one second primary signal input 210 of a charge pump converter 500. Indeed, said at least one second primary signal input 210 may be connected to, preferably directly connected to an at least one primary signal output 250 of a following charge pump converter 500 and/or to receive a main signal, preferably from an antenna, from an integrated circuit and/or from a charge pump converter 500, and said at least one first primary signal input 230 may receive a first control signal and said at least one primary bias input 220 may establish a voltage value and/or a current value of said at least one primary gate controller 200.

Further, said at least one primary gate controller 200 may comprise at least one primary switching element 240 having a primary conduction path 245 with a first primary terminal 241 and a second primary terminal 242, and a primary gate 243 configured to control the current flowing through said primary conduction path 245: said primary conduction path 245 may provide said at least one primary signal. By controlling, the skilled man in the art would understand that the current flowing through said primary conduction path 245 or said secondary conduction path 345 may be varied in amplitude, frequency, and/or in phase such as to be transmitted to another charge pump converter for instance as shown in FIGS. 1A and 1B.

Said primary gate 243 may be also connected to, preferably directly connected to said at least one first primary signal input 230 preferably via at least one primary coupling capacitor 231 and to said at least one primary bias input 220 via at least one primary bias element 221, like at least one first primary bias current flow controller 221. So, the charge pump converter allows adjusting the bias voltage of said primary gate 243 by coupling said primary gate 243 of the switching element to the output of the previous charge pump converter and/or said at least one bias input, which sets the DC gate's voltage reference bias.

Similarly to said at least one primary gate controller 200, said at least one secondary gate controller 300 may comprise at least one secondary signal output 350, at least one first secondary signal input 330, at least one secondary bias input 320 and at least one second secondary signal input 310. Said secondary gate 343 may be also connected to, preferably directly connected to said at least one first secondary signal input 330 preferably via at least one secondary coupling capacitor 331 and to said at least one secondary bias input 320 via at least one secondary bias element 321, like at least one first secondary bias current flow controller 321.

Said at least one secondary signal output 350 may be connected to at least one power control unit 100 or in series to a second circuit an at least one second secondary signal input 310 of a charge pump converter 500. Indeed, said at least one second secondary signal input 310 may be connected to, preferably directly connected to an at least one secondary signal output 350 of a following charge pump converter 500 and/or to receive said main signal, preferably from an antenna, from an integrated circuit and/or from a charge pump converter 500, and said at least one first secondary signal input 330 may receive a second control signal, and said at least one secondary bias input 320 may establish a voltage value and/or a current value of said at least one secondary gate controller 300. As shown in FIG. 1B, said at least one first primary signal input 230 may be connected to, preferably directly connected to said at least one primary signal output 250 and said at least one first secondary signal input 330 may be connected to, preferably directly connected to said at least one secondary signal output 350.

Further, said at least one secondary gate controller 300 may comprise at least one secondary switching element 340 having a secondary conduction path 345 with a first secondary terminal 341 and a second secondary terminal 342, and a secondary gate 343 configured to control the current flowing through said secondary conduction path 345: said secondary conduction path 345 may provide said at least one secondary signal.

Said secondary gate 343 may be also configured to be connected to, preferably directly connected to said at least one first secondary signal input 330, via at least one secondary coupling capacitor 331, and to said at least one secondary bias input 320. So, the charge pump converter allows adjusting the bias voltage of said secondary gate 343 by coupling the said secondary gate 343 of the switching element to the output of the previous charge pump converter and said at least one bias input, which sets the DC gate's voltage reference bias.

In order to adjust the bias voltage of the gates 243, 343, the gates 243, 343 of the switching elements in said at least one primary gate controller 200 and said at least one secondary gate controller 300 may be coupled to the output of the previous charge pump converter and/or said at least one bias input 220, 320, which sets the DC gate's voltage reference bias. More specifically, the present invention may comprise said at least one primary gate controller 200 and said at least one secondary gate controller 300 having said primary gate 243, said at least one primary bias input 220 connected to, preferably directly connected to said primary gate 243 through a bias element like a resistor or a transistor and said secondary gate 343, said at least one secondary bias input 320 connected to, preferably directly connected to said secondary gate 343 through at least one primary bias element 221 and/or at least one secondary bias element 321 like a resistor or a transistor respectively such as to control the DC voltage bias of said primary gate 243 and said secondary gate 343 and therefore the conductivity of at least one primary switching element 240 and at least one secondary switching element 340 respectively. Said bias inputs, more precisely said at least one primary bias input 220 and said at least one secondary bias input 320 may be properly connected to, preferably directly connected to internal nodes of said charge pump converter 500 such that said at least one primary gate controller 200 and said at least one secondary gate controller 300 may be self-biased without using bias-reference external to the charge pump. As it may be in FIG. 1B, where said at least one primary bias input 220 may be directly connected to, preferably directly connected to said at least one second primary signal input 210, and said at least one secondary bias input 320 may be directly connected to, preferably directly connected to said at least one second secondary signal input 310.

As previously mentioned, said bias element may be a resistor or a transistor. Indeed, said at least one primary bias input 220 may comprise at least one first primary bias current flow controller 221, like at least one first primary bias transistor 221. In some embodiments, said primary gate 243 may be connected to, preferably directly connected to said second primary terminal 242, rather said at least one primary signal output 250 via an at least one second primary bias current flow controller 222 and/or at least one second primary bias transistor thus the primary conduction path 245 of the primary switching element 240 may be controlled. The same may apply for the secondary switching element 340 with at least one first secondary bias current flow controller 221, like at least one first secondary bias transistor 221 and at least one second secondary bias current flow controller 322 like at least one second secondary bias transistor.

The applicant does not exclude the gate voltage of said primary gate 243 may be determined by configuration of said at least one first primary bias current flow controller 221, like a resistor, and at least one second primary bias current flow controller 222, like a resistor, forming a resistive divider and the DC primary gate voltage may be comprised between the voltage value of said at least one second primary signal input 210 and of a second primary terminal 242. The same may apply for the secondary switching element 340.

According to some embodiments not represented, instead of a resistor as said at least one first primary bias current flow controller 221 and/or as said at least one second primary bias current flow controller 222, a transistor and preferably by a MOS transistor may be used such as the primary conduction path 245 of the primary switching element 240 may be controlled and may make said charge pump converter 500 programmable and more specifically said at least one primary gate controller 200 programmable. The same may apply for the secondary switching element 340.

Further, said at least one first primary bias transistor 221 may be trimmed, via at least one impedance controlling terminal 513, such as to control the current flowing through and/or said at least one first primary bias transistor 221 and/or wherein said at least one second primary bias transistor may be trimmed, via at least one impedance controlling terminal 513, such as to control the current flowing through said at least one first primary bias transistor 221. So, the primary conduction path 245 of the switching element 240 may be controlled which makes the charge pump converter programmable via an integrated circuit, a micro-controller and/or a processor. The same may apply for the secondary switching element 340.

As shown in FIGS. 1A and 1B, said at least one first primary bias transistor 221 and/or said at least one second primary bias transistor 222 may comprise at least one impedance controlling terminal 513 configured to trim the current flowing through said at least one first primary bias transistor 221 and/or said at least one second primary bias transistor 222 as aforementioned.

Thanks to the arrangements according to the invention, the conduction path of at least one primary switching element 240 and/or at least one secondary switching element 340 may be controlled which makes the charge pump converter programmable via said at least one power control unit 100 and more particularly via said first input impedance controlling terminal 513.

The same may apply for said at least one first secondary bias transistor and said at least one second secondary bias transistor.

The applicant may want to have a linear control of said charge pump converter 500 programmable and more specifically said at least one primary gate controller 200 programmable a potentiometer and/or the digital potentiometer may replace said transistor and preferably said MOS transistor in linear with a controlled channel resistance. Since the plurality of primary bias transistor and secondary bias transistor may comprise at least one first primary bias transistor 221 and/or at least one second primary bias transistor 222, the conduction path 245 of the primary switching element 240 may be linearly controlled and may make the charge pump converter programmable via said at least one power control unit 100. The same may apply for the secondary switching element 340.

Thus, for a given input power, by maximizing the output power in said charge pump converter 500 relatively constant over process and temperature variations for example, input resistance $R_{tp}$ and rectifier efficiency eff may be obtained.

It follows that said power control unit 100, by reducing the spread of the match parameter makes the Sensitivity and the reading distance tag performance more constant and reliable across temperature and process variations.

It also follows that said power control unit 100, by reducing the spread of the rectifier input resistance $R_{tp}$ makes the tag quality factor Q more constant over temperature and process variations enabling more consistent Sensitivity and tag reading distance performances across the UHF band.

At the resonance, i.e. when $X_\alpha = -X_{ts}$, it may be possible that the equivalent series resistance at resonance $R_{ts}$ matches the antenna resistance $R_\alpha$ minimizing the mismatch loss ML.

If the $P_{avail}$ may be the minimum input power at which the Tag can operate, then said power control unit 100 may minimize the tag Sensitivity and may maximize the tag reading distance over temperature and process variations.

Thus, using a PSBGC rectifier and said power control unit 100, it may be possible to perform an automatic control of the input resistance, via at least one impedance controlling terminal 513, and efficiency of the match parameter of the PSBGC rectifier.

In order to achieve this objective, said power control unit 100 may comprise at least one reference circuit 110, and at least one control unit 120.

More precisely, the control on the rectifier input resistance and efficiency may act on a gate controller of a charge pump converter.

Said charge pump converter comprising at least a switching element having a conduction path with a first terminal and a second terminal, and a gate configured to control the current flowing through said conduction path, said conduction path being configured to provide a signal. Said gate controller comprising at least a coupling capacitor and at least a signal input configured to be connected to a second terminal of a charge pump converter and/or to receive a signal, preferably from an antenna, from an integrated circuit and/or from a charge pump converter and to transfer said signal to said first terminal of conduction path of said at least a switching element.

Further, said gate controller of a charge pump converter may comprise at least a bias input configured to be connected to said gate and to establish a voltage value and/or a current value of said gate.

Thus, for a given input power, by maximizing the output power in a PSBGC charge-pump relatively constant over process and temperature variations for example, input resistance $R_{tp}$ and rectifier efficiency eff are obtained.

It follows that said power control unit 100, by reducing the spread of the match parameter makes the Sensitivity and the reading distance tag performance more constant and reliable across temperature and process variations.

It also follows that said power control unit 100, by reducing the spread of the rectifier input resistance $R_{tp}$ makes the tag quality factor Q more constant over temperature and process variations enabling more consistent Sensitivity and tag reading distance performances across the UHF band.

At the resonance, i.e. when $X_\alpha = -X_{ts}$, it may be possible that the equivalent series resistance at resonance $R_{ts}$ matches the antenna resistance $R_\alpha$ minimizing the mismatch loss ML.

If the $P_{avail}$ is the minimum input power at which the Tag can operate, then said power control unit 100 may minimize the tag Sensitivity and may maximize the tag reading distance over temperature and process variations.

Thus, using a PSBGC rectifier and said power control unit 100, it is possible to perform an automatic control of the input resistance and efficiency of the match parameter of the PSBGC rectifier.

In order to achieve this objective, said power control unit 100 comprising at least a control circuit 110, and at least a control unit 120.

Said at least control circuit 110 is configured to sense said output power of said at least one charge pump converter 500 through said at least one primary signal output 250 and said at least one secondary signal output 350 and to transmit a sensed power value 191, which may comprise a voltage sensed power value and/or current sensed power value, as a function of the sensed output power. According to an embodiment, said voltage sensed power value and/or said current sensed power value may be transmitted as analog signal to said at least a control unit 120, which is quicker than digital signal.

Said at least a control unit 120 may be configured to receive said sensed power value, to establish a control value and to send said control value to said impedance controlling terminal 513 such as to modify said input impedance. Thus, said power control unit 100 may sense the received power and may take actions to minimize the tag sensitivity and thus may maximize the tag reading distance.

As depicted in FIGS. 1A and 1B, said control circuit 110 may be configured to control an output current from said at least one charge pump converter 500 and to measure an output voltage between said at least one primary signal output 250 and said at least one secondary signal output 350 at lower input power levels across said at least one second primary signal input 210 and said at least one second secondary signal input 310, and/or to control said output voltage and measure said output current at higher input power levels. Therefore, said control circuit 110 may comprise at least one control circuit configured to determine at least a first physical quantity between said at least one second primary signal input 210 and said at least one second secondary signal input 310 and to measure at least a second physical quantity.

In other words, said at least one charge pump converter 500 output power is sensed with said at least a control circuit 110, which comprises at least a power input terminal 112 configured to sense said output current and/or said output voltage value of said at least one charge pump converter 500 and at least an internal reference 115 configured to set a reference value. During the adaptation of the impedance, said at least an internal reference 115 may be set such that said output current and/or said output voltage value of said at least one charge pump converter 500 is slightly above the power-on-reset or POR value.

On top of that, at least a comparison circuit 117, comprised in said at least control circuit 110, is configured to compare said reference value to said output current value and/or said output voltage value sensed by at least a power input terminal 112.

More specifically, said at least control circuit 110 is configured to conduct a current value by diverting said output current from said at least one primary signal output 250 to said at least one secondary signal output 350 such as to evaluate said sensed power value.

Said output current is diverted by at least a current limited buffer 119 of said at least a control circuit 110. Said at least a current limited buffer 119 is configured to divert the current from said at least one primary signal output 250 to said at least one secondary signal output 350 such as to evaluate the sensed power value. Indeed, said at least a current limited buffer 119 may be a shunt regulator used as control circuit, and said diverted current from said at least one primary signal output 250 to said at least one secondary signal output 350 or current shunt may be proportional to said sensed power value.

The analog output of said at least control circuit 110 carries the information of said at least one charge pump converter 500 output power, which is converted to a digital word by said at least control unit 120, and more specifically by at least a converter 122. The latter, i.e. said at least a converter 122, is configured to convert said sensed current value and/or said sensed voltage value of said at least one charge pump converter 500 into a digital voltage value 124 and/or a digital current value 124, in other word, a copy of said diverted current 121 is converted to a digital word 124 by said at least a converter 122.

Said at least control unit 120, previously mentioned, comprises at least a controller 123 configured to establish an established voltage value and/or an established current value as a function of said sensed current value and/or said sensed voltage value of said at least one charge pump converter 500, such as to find the best trim code to maximize Pout_d.

Thus, thanks to this arrangement, said power control unit 100 may reduce the spread of at least Input Resistance, Mismatch Loss, Quality Factor, Rectifier Efficiency and/or Match parameter over temperature and process variations.

In addition to the above advantage, if said at least one charge pump converter 500, which may be a rectifier, is designed such that the tag input resistance matches the antenna resistance at the minimum input power at which the tag can operate, the Tag Sensitivity may be minimized and/or the Tag reading distance may be maximized over temperature and process variations.

FIGS. 4A-4G represent Tag input parallel resistance $R_{tp}$, input equivalent series resistance $R_{ts}$, Tag mismatch loss ML and Tag Quality Factor Q respectively, for a given input power as a function of temperature and over three process corners for a tag using an 8-stages differential Dickson charge pump with rectifier and with said power control unit 100. In the not trimmed case the trim code to the rectifier is kept fixed. In the trimmed case the trim code to the rectifier is determined by said power control unit 100 control loop.

Figure 5:
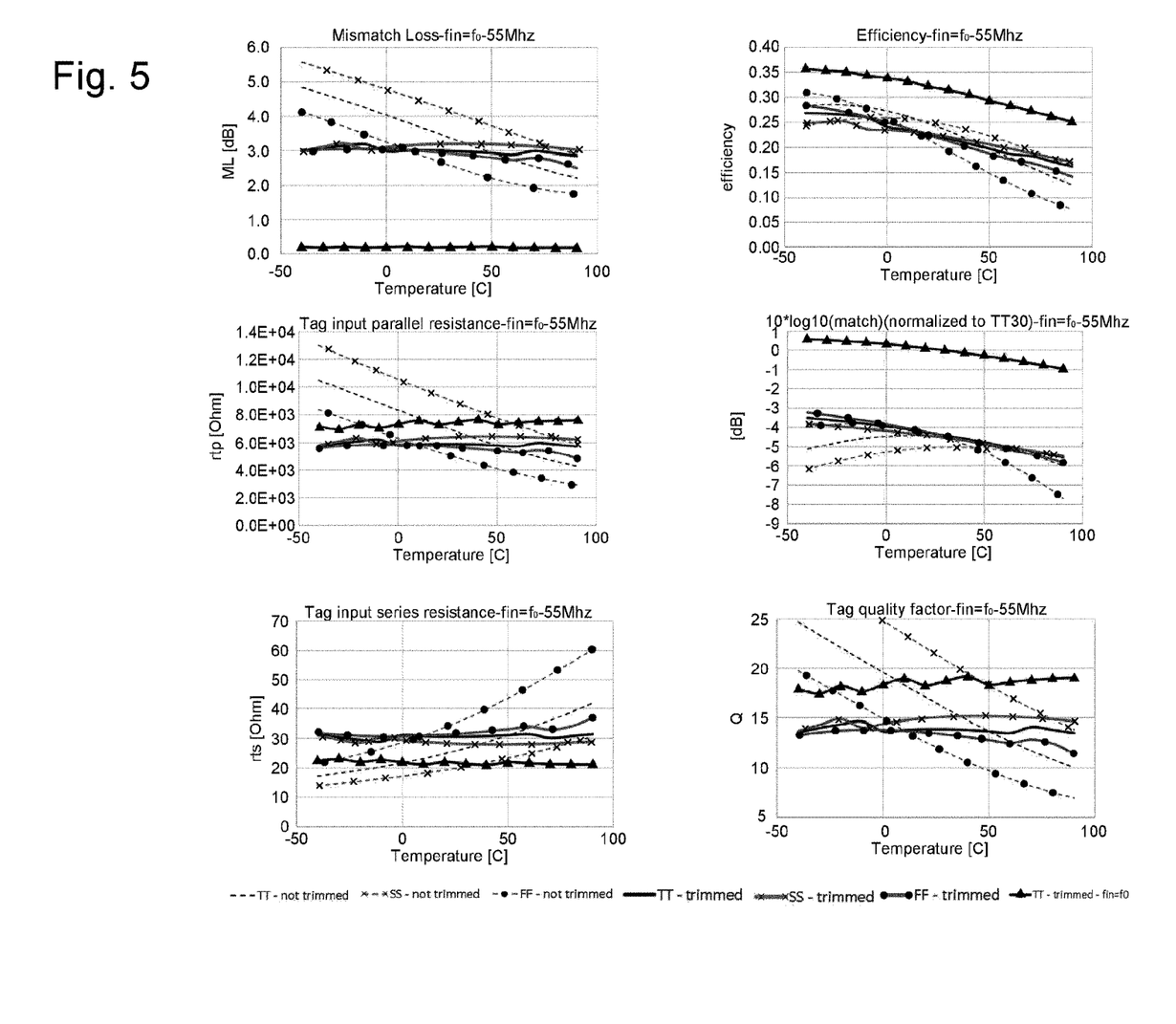
FIG. 5 represents a AutoMatch tag performances at $f_{in}=f_0-55$ MHz.

The AutoMatch tag performances are here evaluated for a given input power at $f_{in}=f_0-55$ MHz, see FIG. 5, with a series resonant RLC antenna-tag equivalent circuit tuned at $f_0$ and with an antenna quality factor equals to 16. In all the plots the performances out of resonance are compared with the TT-trimmed case at $f_{in}=f_0$. The «match» parameter is maximized in all the conditions even with an input frequency out of resonance $X_{ca} \neq X_{ts}$.

Figure 6:
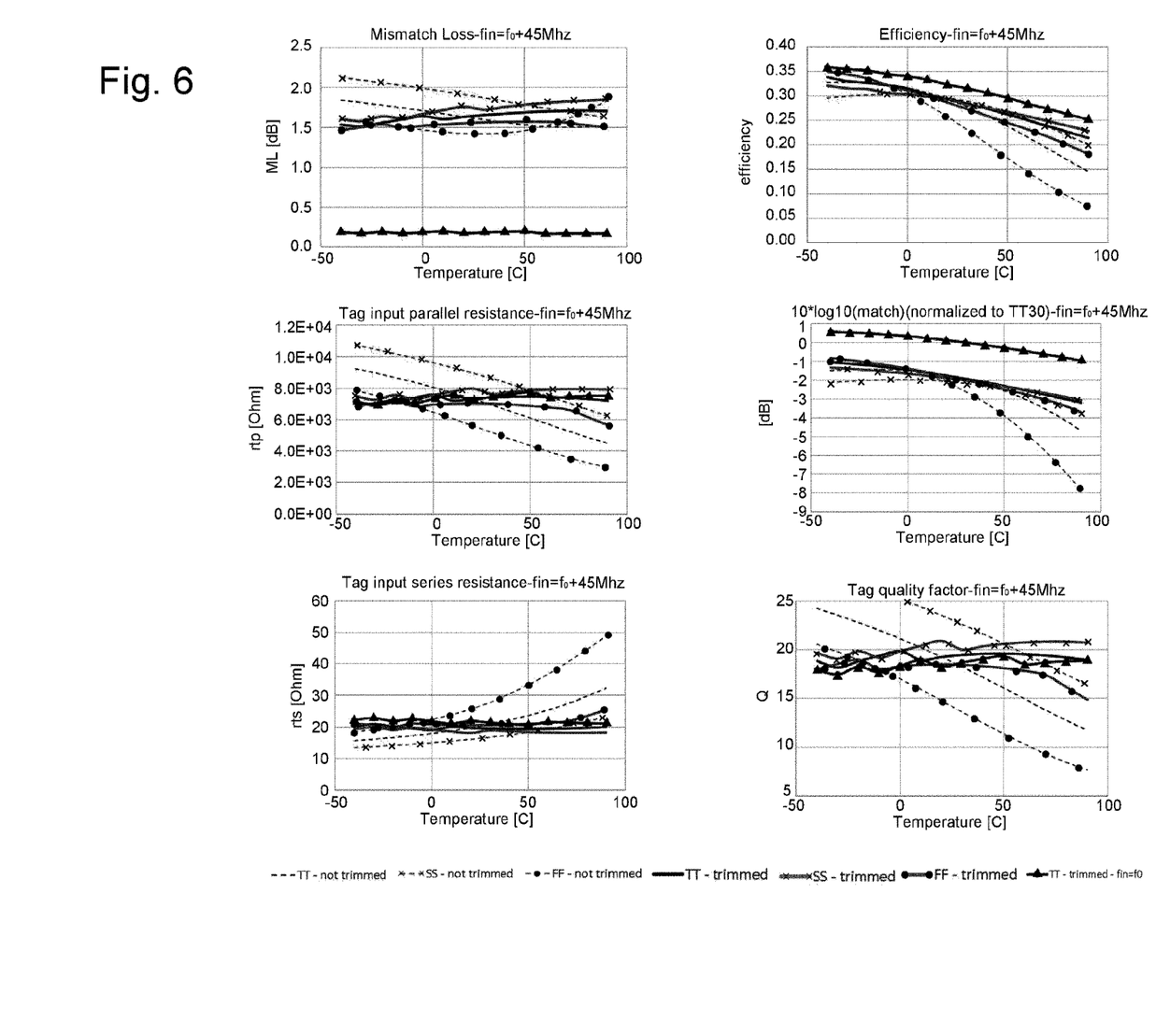
Figure 7:
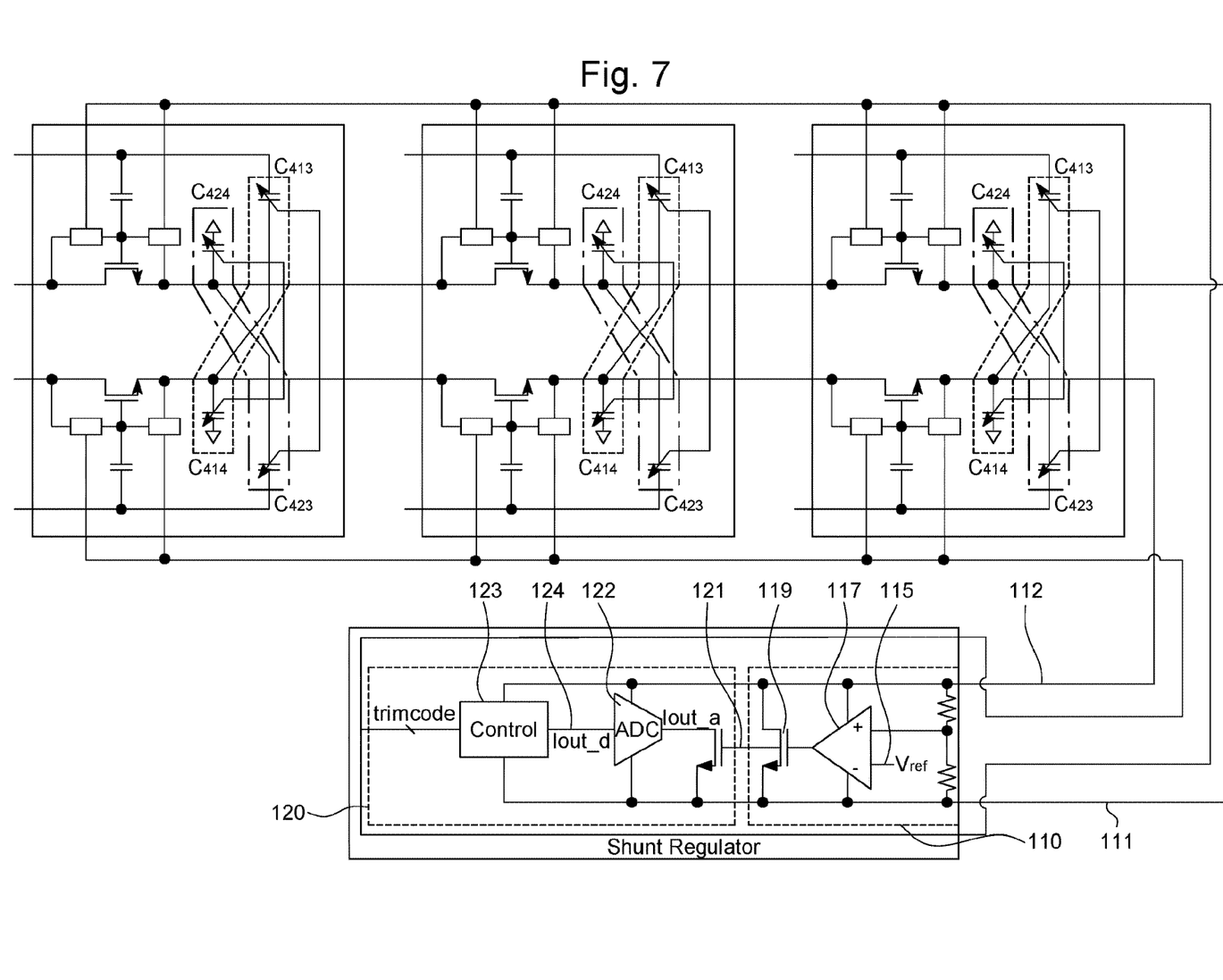

In FIG. 6, the AutoMatch tag performances are evaluated for a given input power at $f_{in}=f_0+45$ MHz with a series resonant RLC antenna-tag equivalent circuit tuned at f0 and with an antenna quality factor equals to 16. In all the plots the performances out of resonance are compared with the TT-trimmed case at $f_{in}=f_0$. The «match» parameter is maximized in all the conditions even with an input frequency out of resonance $X_{ca} \neq X_{ts}$.

The invention claimed is:

1. A power control unit configured to monitor an output power of a charge pump converter having an input impedance between a second primary signal input and a second secondary signal input, and having a primary signal output, a secondary signal output, and an input impedance controlling terminal configured to be plugged to said power control unit, said input impedance controlling terminal being configured to modify said input impedance, said power control unit comprising:
a control circuit configured to sense said output power of said charge pump converter through said primary signal output and said secondary signal output, and transmit a sensed power value as a function of the sensed output power; and
a control unit configured to receive said sensed power value, establish a control value, and send said control value to said impedance controlling terminal so as to modify said input impedance,
wherein the control circuit is further configured to control an output current from the charge pump converter and measure an output voltage between the primary signal output and said secondary signal output at lower input power levels across the second primary signal input and the second secondary signal input, and/or control the output voltage and measure the output current at higher input power levels, the control circuit further comprising a power input terminal configured to sense the output current and/or the output voltage value of the charge pump converter, a resistive divider connected to the power input terminal to be compared in a comparison circuit to an internal reference configured to set a reference value, and a current limited buffer at the output of the control circuit linked to the control unit.

2. The power control unit according to claim 1, wherein said sensed power value comprises a voltage sensed power value and/or a current sensed power value.

3. The power control unit according to claim 1, wherein said control circuit is further configured to determine a first physical quantity between said second primary signal input and said second secondary signal input, and measure at least a second physical quantity.

4. The power control unit according to claim 1, wherein said control circuit is further configured to conduct a current value by diverting said output current from said one primary signal output to said one secondary signal output so as to evaluate the sensed power value.

5. The power control unit according to claim 1, wherein said control unit further comprises a controller configured to establish an established voltage value and/or an established current value as a function of said sensed current value and/or said sensed voltage value of said charge pump converter.

6. The power control unit according to claim 1, further comprising a bias supplier including a converter configured to convert said sensed current value and/or said sensed voltage value of said charge pump converter into a digital voltage value and/or a digital current value.

7. A control system device comprising the power control unit according to claim 1 and the charge pump converter, said charge pump converter comprising a primary gate controller and a secondary gate controller, said primary gate controller comprising at least one of:
a primary signal output configured to be connected to a second primary signal input of the charge pump converter and/or a first circuit;
a first primary signal input configured to receive a first control signal;
a primary bias input configured to establish a voltage value and/or a current value of said primary gate controller; and
a second primary signal input configured to be connected to the primary signal output of the charge pump converter and/or to receive said main signal; from an integrated circuit, at least one primary signal and/or from the charge pump converter; and
said at least one secondary gate controller comprising at least one of:
a secondary signal output configured to be connected to the second secondary signal input of the charge pump converter and/or a second circuit;
a first secondary signal input configured to receive a second control signal;
a secondary bias input configured to establish a voltage value and/or a current value of said secondary gate controller; and
a second secondary signal input configured to be connected to the secondary signal output of the charge pump converter and/or to receive a main signal from an integrated circuit, the secondary signal and/or from the charge pump converter,
said first primary signal input being configured to be connected to said secondary signal output and said first secondary signal input being configured to be connected to said primary signal output.

8. The control system device according to claim 7, wherein said primary gate controller comprises a primary switching element having a primary conduction path with a first primary terminal and a second primary terminal, and a primary gate configured to control the current flowing through said primary conduction path, said primary conduction path being configured to provide said primary signal,
wherein said primary gate is configured to be connected to said first primary signal input and to said primary bias input, and/or wherein said at least one secondary gate controller comprises a secondary switching element having a secondary conduction path with a first secondary terminal and a second secondary terminal, and a secondary gate configured to control the current flowing through said secondary conduction path, said secondary conduction path being configured to provide said secondary signal, said secondary gate is being configured to be connected to said first secondary signal input and to said secondary bias input.

9. The control system device according to claim 7, wherein said primary bias input comprises a plurality of primary bias current flow controller comprising a first primary bias current flow controller and/or a second primary bias transistor and/or wherein said secondary bias input comprises a plurality of secondary bias current flow controllers comprising a first secondary bias current flow controller and/or a second secondary bias transistor.

10. The control system device according to claim 7, wherein said charge pump converter comprises the input impedance controlling terminal configured to be plugged to said power control unit so as to modify said input impedance.

11. The control system device according to claim 7, wherein said input impedance controlling terminal is configured to control the current flowing through said primary conduction path or said secondary conduction path and of said first primary bias current flow controller said second primary bias transistor, said first secondary bias current flow controller and/or said second secondary bias transistor.

12. The power control unit according to claim 1, wherein the control circuit further comprises:
- a power input terminal configured to sense the output current and/or the output voltage value of said at least one charge pump converter;
- an internal reference configured to set a reference value;
- a comparison circuit configured to compare the reference value to the output current value and/or the output voltage value; and
- a current limited buffer configured to divert the current from the primary signal output to the secondary signal output so as to evaluate the sensed power value.

* * * * *